United States Patent
Lin et al.

(10) Patent No.: US 10,715,167 B2
(45) Date of Patent: Jul. 14, 2020

(54) CONTROL CIRCUIT AND CONTROL METHOD OF SUCCESSIVE APPROXIMATION REGISTER ANALOG-TO-DIGITAL CONVERTER

(71) Applicant: REALTEK SEMICONDUCTOR CORPORATION, Hsinchu (TW)

(72) Inventors: Sheng Hsiung Lin, Tainan (TW); Shih-Hsiung Huang, Miaoli County (TW)

(73) Assignee: REALTEK SEMICONDUCTOR CORPORATION, Hsinchu (TW)

(*) Notice: Subject to any disclaimer, the term of this patent is extended or adjusted under 35 U.S.C. 154(b) by 0 days.

(21) Appl. No.: 16/519,308

(22) Filed: Jul. 23, 2019

(65) Prior Publication Data
US 2020/0091925 A1   Mar. 19, 2020

(30) Foreign Application Priority Data

Sep. 13, 2018 (TW) ............... 107132311 A

(51) Int. Cl.
| | |
|---|---|
| *H03M 1/12* | (2006.01) |
| *H03M 1/46* | (2006.01) |
| *H03M 1/42* | (2006.01) |
| *H03M 1/00* | (2006.01) |
| *H03M 1/10* | (2006.01) |
| *H03M 1/80* | (2006.01) |
| *H03M 1/06* | (2006.01) |

(52) U.S. Cl.
CPC ......... *H03M 1/462* (2013.01); *H03M 1/1245* (2013.01); *H03M 1/42* (2013.01); *H03M 1/466* (2013.01); *H03M 1/00* (2013.01); *H03M 1/001* (2013.01); *H03M 1/06* (2013.01); *H03M 1/10* (2013.01); *H03M 1/12* (2013.01); *H03M 1/802* (2013.01)

(58) Field of Classification Search
CPC .......... H03M 1/802; H03M 1/12; H03M 1/00; H03M 1/10; H03M 1/06; H03M 1/001
USPC ................ 341/172, 155, 161, 120, 118, 110
See application file for complete search history.

(56) References Cited

U.S. PATENT DOCUMENTS

2012/0306679 A1* 12/2012 Zhu ................... H03M 1/002
                                                              341/155

OTHER PUBLICATIONS

Chi-Hang Chan et al., IEEE paper."A 6 b 5 GS/s 4 Interleaved 3 b/Cycle SAR ADC", Feb. 2016, pp. 365-377, vol. 51, No. 2, IEEE Journal of Solid-State Circuits.

(Continued)

*Primary Examiner* — Joseph J Lauture
(74) *Attorney, Agent, or Firm* — WPAT, PC

(57) ABSTRACT

This invention discloses a control circuit and a control method of a successive approximation register analog-to-digital converter (SAR ADC). The SAR ADC includes a comparator and a switched-capacitor digital-to-analog converter (DAC). The control circuit includes a memory, an inverter and a data path. The memory is configured to store an output value of the comparator. The inverter has an output coupled to a first end of a capacitor of the switched-capacitor DAC. A second end of the capacitor is coupled to an input of the comparator. The data path, coupled between an output of the comparator and an input of the inverter, temporarily causes a voltage at the first end of the capacitor to be controlled by the output value of the comparator. The data path does not contain any memory.

10 Claims, 8 Drawing Sheets

(56) References Cited

OTHER PUBLICATIONS

Chun-Cheng Liu et al., IEEE paper."A 10-bit 50-MS/s SAR ADC With a Monotonic Capacitor Switching Procedure", Apr. 2010, pp. 731-740, vol. 45, No. 4, IEEE Journal of Solid-State Circuits.
Wei-Hsin Tseng et al., IEEE paper."A 12-bit 104 MS/s SAR ADC in 28 nm CMOS for Digitally-Assisted Wireless Transmitters", 2016, pp. 1-10, IEEE Journal of Solid-State Circuits.
Ying-Zu Lin et al., IEEE paper."A 8.2-mW 10-b 1.6-GS/s 4x TI SAR ADC with Fast Reference Charge Neutralization and Background Timing-Skew Calibration in 16-nm CMOS", 2016, pp. 204-205, Symposium on VLSI Circuits Digest of Technical Papers.
OA letter of counterpart TW application of application No. 107128844 dated Feb. 22, 2019. summary: Claim 10 is anticipated by reference 1. Reference 1 renders claims 1-9 obvious.
Yan Song et al., A 0.6-V 10-bit 200-kS/s Fully Differential SAR ADC With Incremental Converting Algorithm for Energ Efficient Applications.( reference 1), Apr. 2016, pp. 449-458, vol. 63, No. 4, IEEE Transactions on Circuits and Systems.

\* cited by examiner

CONTROL CIRCUIT AND CONTROL METHOD OF SUCCESSIVE APPROXIMATION REGISTER ANALOG-TO-DIGITAL CONVERTER

BACKGROUND OF THE INVENTION

1. Field of the Invention

The present invention generally relates to successive approximation register analog-to-digital converters (SAR ADCs), especially to control circuits and control methods of SAR ADCs.

2. Description of Related Art

In the following description, two ends of a capacitor are defined as a top plate and a bottom plate, respectively; the top plate refers to the end coupled to the comparator, whereas the bottom plate refers to the end not coupled to the comparator. Such definition is made only for the ease of discussion and not necessarily related to "top" and "bottom" in the actual circuit.

FIG. 1 is a functional block diagram of a conventional successive approximation register analog-to-digital converter (SAR ADC). The SAR ADC is used to convert the analog input signal Vi into a digital signal (i.e., the digital code D). The SAR ADC primarily includes a switched-capacitor digital-to-analog converter (DAC) 110, a comparator 120, a successive approximation register (SAR) 130, and a control circuit 140. The SAR ADC operates according to the clock CLK. In a certain operation of the SAR ADC, the SAR 130 determines a bit value (1/0) of one bit of the digital code D according to the comparison result of the comparator 120, and the control circuit 140 generates the control signal G according to the digital code D. The control signal G controls the terminal voltage of the capacitors in the switched-capacitor DAC 110 (i.e., controlling the bottom plate of the capacitor to be coupled to the reference voltage Vref1 or the reference voltage Vref2), so that the charges on the capacitors redistribute, leading to a change in the voltage at the inverting input or non-inverting input of the comparator 120. As a result, the voltage to be compared by the comparator 120 in the subsequent comparison operation change. The above steps are repeated to determine the digital code D bit by bit (from the most significant bit (MSB) to the least significant bit (LSB)); meanwhile, the value that the digital code D represents gradually approaches the input signal Vi.

FIG. 2 shows an internal circuit of the switched-capacitor DAC 110. The switched-capacitor DAC 110 includes two capacitor arrays, each of which includes n capacitors (C1 to Cn or C1' to Cn') and n switches (SW1 to SWn or SW1' to SWn') (n is a positive integer), meaning that the digital code D contains n+1 bits (D1 to Dn+1, D1 being the LSB and Dn+1 being the MSB), and the control signal G contains n sub-control signals G1 to Gn and n sub-control signals # G1 to # Gn. The sub-control signals G1 to Gn (or # G1 to # Gn) correspond to the bits D2 to Dn+1, respectively. The switch SWk and the switch SWk' are controlled by the sub-control signals Gk and # Gk, respectively (k is an integer and 1≤k≤n). More specifically, when the switch SWk is switched to the reference voltage Vref1, the switch SWk' is switched to the reference voltage Vref2; when the switch SWk is switched to the reference voltage Vref2, the switch SWk' is switched to the reference voltage Vref1. FIG. 2 also shows that the input signal Vi is a differential signal, which is made up of the signals Vip and Vin, and the switch SWip and the switch SWin are used to sample the input signal Vi.

The control circuit 140 includes n sub-control circuits, and the n sub-control circuits respectively correspond to the switches SW1 to SWn (i.e., respectively corresponding to the capacitors C1 to Cn). FIG. 3 shows the connection between the sub-control circuit 305-$k$ and the switch SWk. The switch SWk is practically an inverter including a transistor Mp and a transistor Mn. The switching state of the switch SWk stands for the transistor Mp and the transistor Mn being turned on or off. The sub-control circuit 305-$k$ includes a memory 310-$k$ and a buffer 320-$k$ and is configured to generate the sub-control signal Gk according to the bit Dk+1. The memory 310-$k$ stores the bit Dk+1, and the buffer 320-$k$, which usually includes a plurality of inverters connected in series, is used to boost the driving capability of the signal.

A path between the input of the sub-control circuit 305-$k$ and the output of the switch SWk is the critical path of the SAR ADC—the shorter the delay on this critical path, the faster the SAR ADC and hence the better the performance (e.g., a higher signal-to-noise-and-distortion ratio (SNDR). The memory 310-$k$ and buffer 320-$k$, however, typically have a significant amount of signal delay, and so the speed and performance of the SAR ADC are negatively affected.

SUMMARY OF THE INVENTION

In view of the issues of the prior art, an object of the present invention is to provide control circuits and control methods of a successive approximation register analog-to-digital converter (SAR ADC), so as to make an improvement to the prior art.

A control circuit of a SAR ADC is provided. The SAR ADC includes a comparator and a switched-capacitor digital-to-analog converter (DAC). The control circuit includes a memory, an inverter, and a data path. The memory is configured to store an output value of the comparator. The inverter has an output coupled to a first end of a capacitor of the switched-capacitor DAC. A second end of the capacitor is coupled to an input of the comparator. The data path is coupled between an output of the comparator and an input of the inverter and configured to cause a voltage at the first end of the capacitor to be temporarily controlled by the output value of the comparator. The data path does not contain any memory.

A control circuit of a SAR ADC is provided. The SAR ADC includes a comparator and a switched-capacitor DAC. The control circuit includes a memory, an inverter, a first switch, and a second switch. The memory is configured to store an output value of the comparator. The inverter has an output coupled to a first end of a capacitor of the switched-capacitor DAC. A second end of the capacitor is coupled to an input of the comparator. The first switch is coupled between an output of the comparator and an input of the inverter. The second switch is coupled between an output of the memory and the input of the inverter. When the first switch is turned on, the second switch is turned off so that a voltage at the first end of the capacitor is not controlled by a value stored in the memory, and the memory stores the output value of the comparator. When the first switch is turned off, the second switch is turned on so that the voltage at the first end of the capacitor is controlled by the value stored in the memory but not controlled by the output value of the comparator.

A control method of a SAR ADC is provided. The SAR ADC includes a comparator and a switched-capacitor DAC.

The control method includes the steps of: controlling, within a time period after a comparison of the comparator is completed, a voltage at a first end of a capacitor of the switched-capacitor DAC not to be controlled by a value stored in a memory; writing a current output value of the comparator to the memory within the time period, and controlling the voltage at the first end of the capacitor to be controlled by the current output value of the comparator; stopping coupling an output of the comparator to the first end of the capacitor to thereby control the voltage at the first end of the capacitor not to be controlled by the current output value of the comparator; and controlling an output of the memory to be coupled to the first end of the capacitor, such that the voltage at the first end of the capacitor is controlled by the value stored in the memory.

According to this invention, the control circuits and control methods of the SAR ADC provide a data path to temporarily bypass the memory and the buffer so that the speed of the control circuit is enhanced. Compared with the conventional technology, the present invention can improve the speed and performance of the SAR ADC, and the circuit is simple and easy to implement.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes control circuits and control methods of a successive approximation register analog-to-digital converters (SAR ADC). On account of that some or all elements of the control circuits of the SAR ADC could be known, the detail of such elements is omitted provided that such detail has little to do with the features of this disclosure and this omission nowhere dissatisfies the specification and enablement requirements. The control methods of the SAR ADC can be performed by the control circuits of the SAR ADC or their equivalents. A person having ordinary skill in the art can choose components or steps equivalent to those described in this specification to carry out the present invention, which means that the scope of this invention is not limited to the embodiments in the specification.

Figure 1:
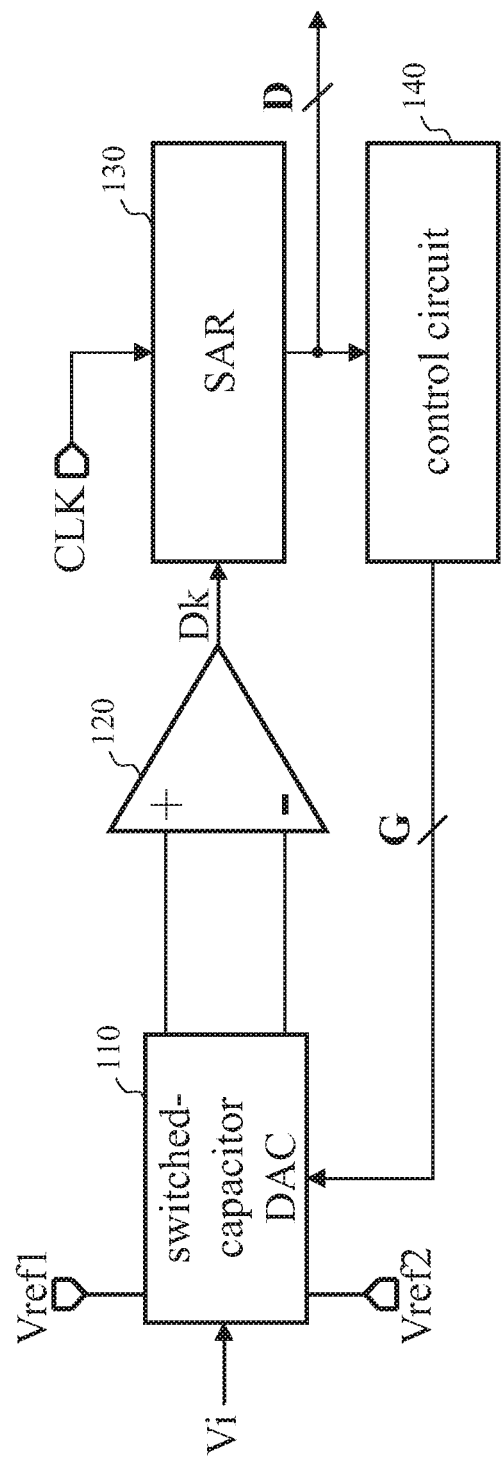
FIG. 1 illustrates a functional block diagram of a conventional SAR ADC.
Figure 2:
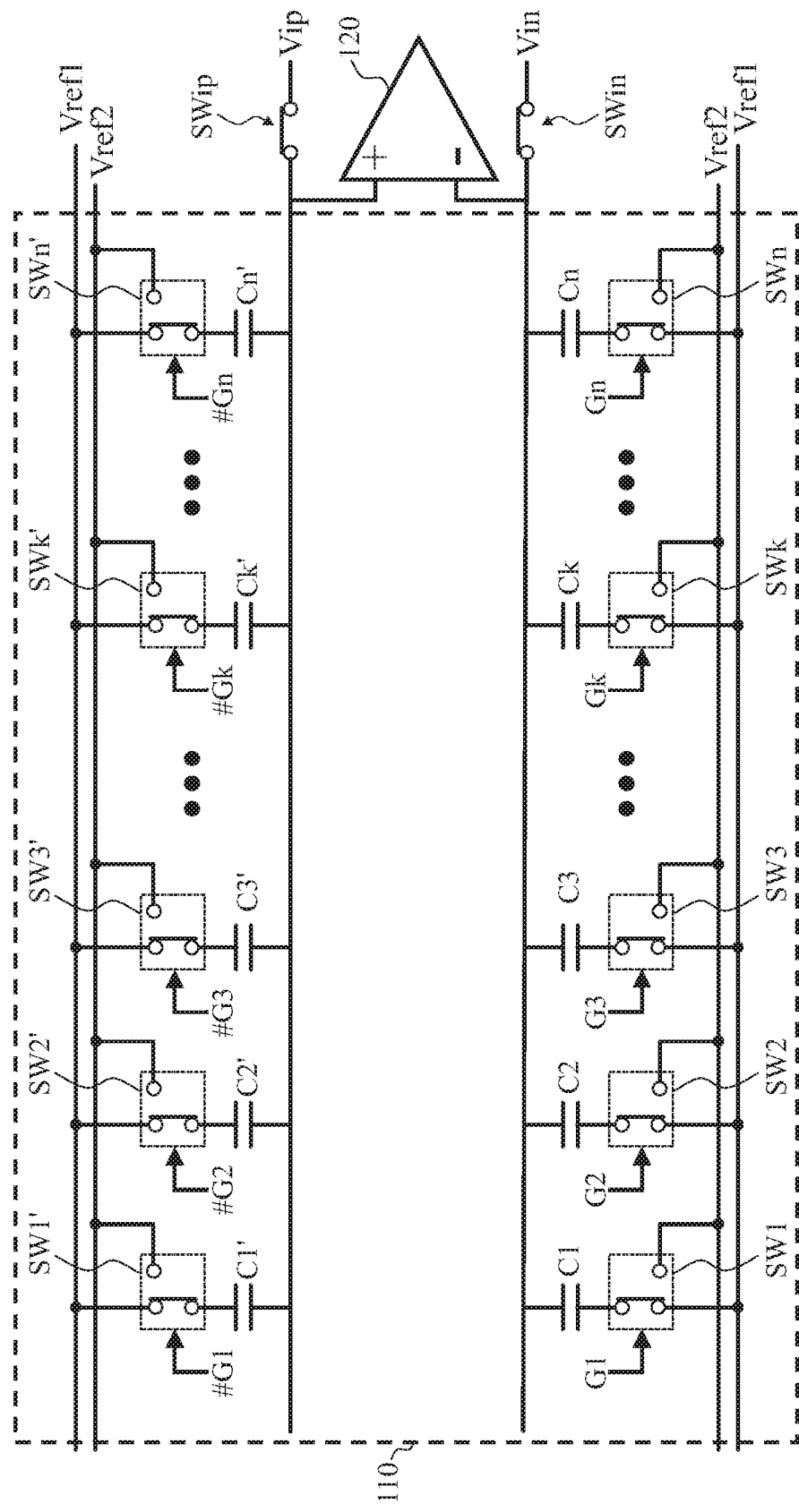
FIG. 2 illustrates an internal circuit of the switched-capacitor DAC.
Figure 3:
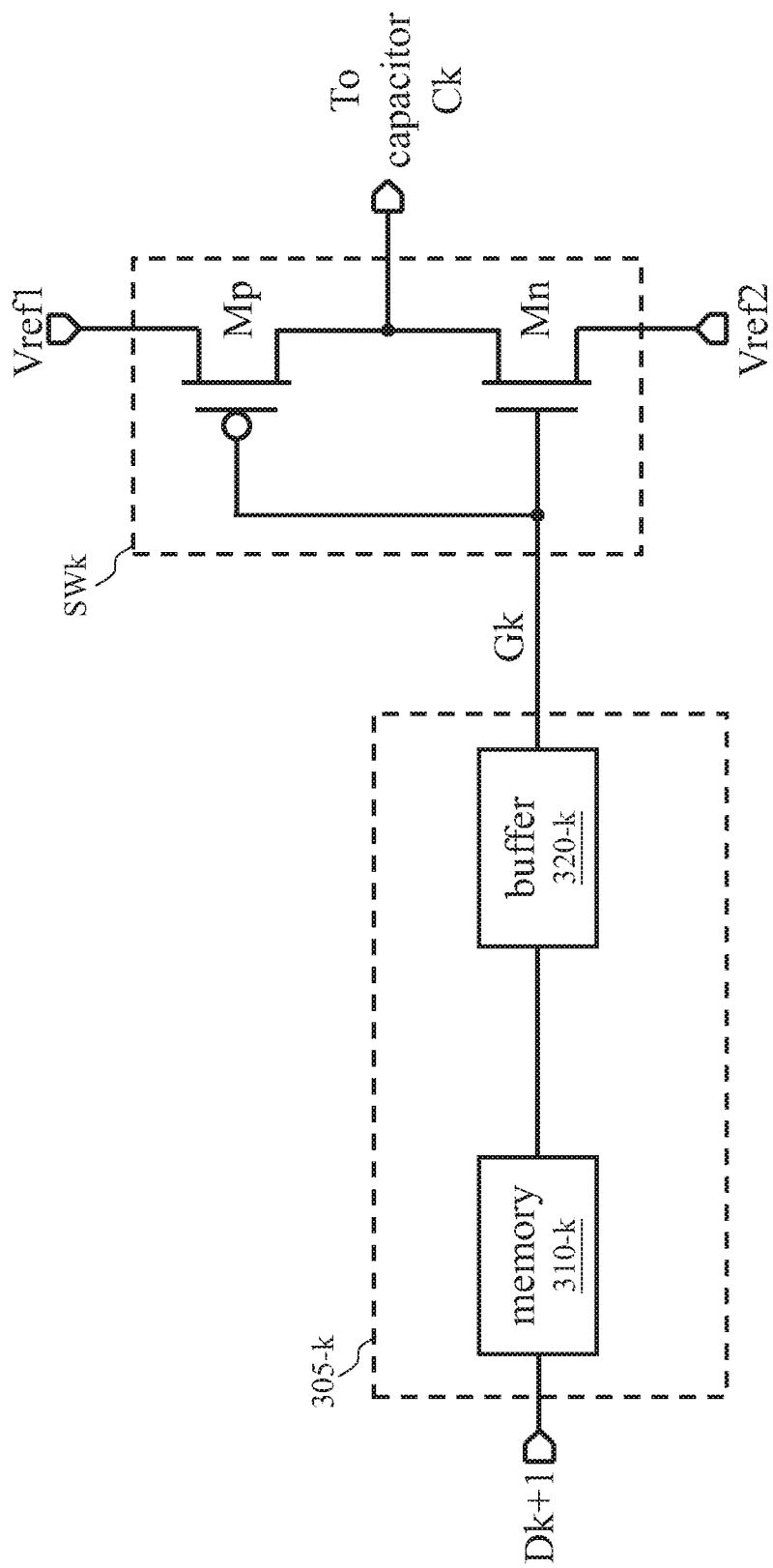
FIG. 3 illustrates the connection between a sub-control circuit and a switch.
Figure 4:
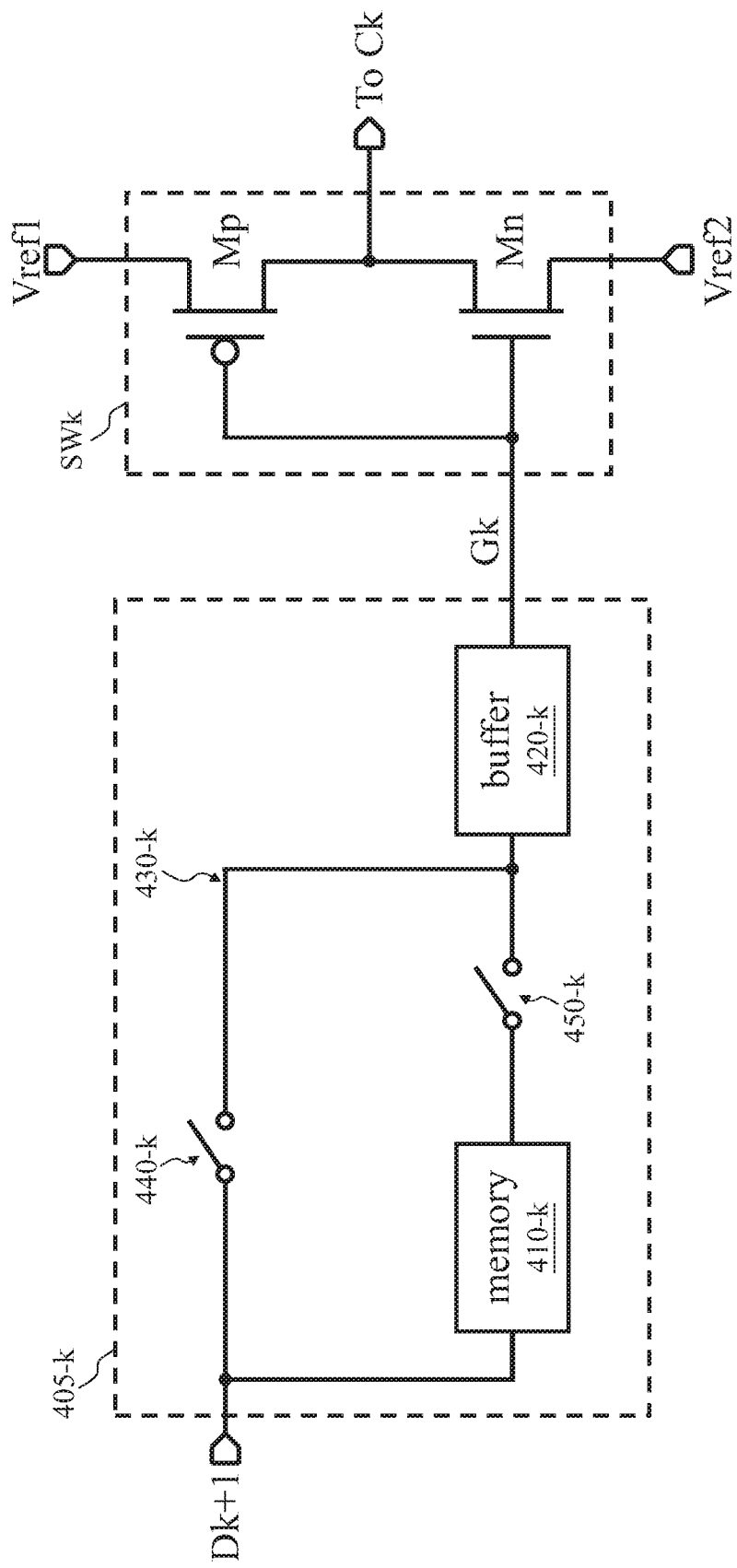
FIG. 4 illustrates a circuit diagram of the sub-control circuit according to an embodiment of the present invention.
Figure 5:
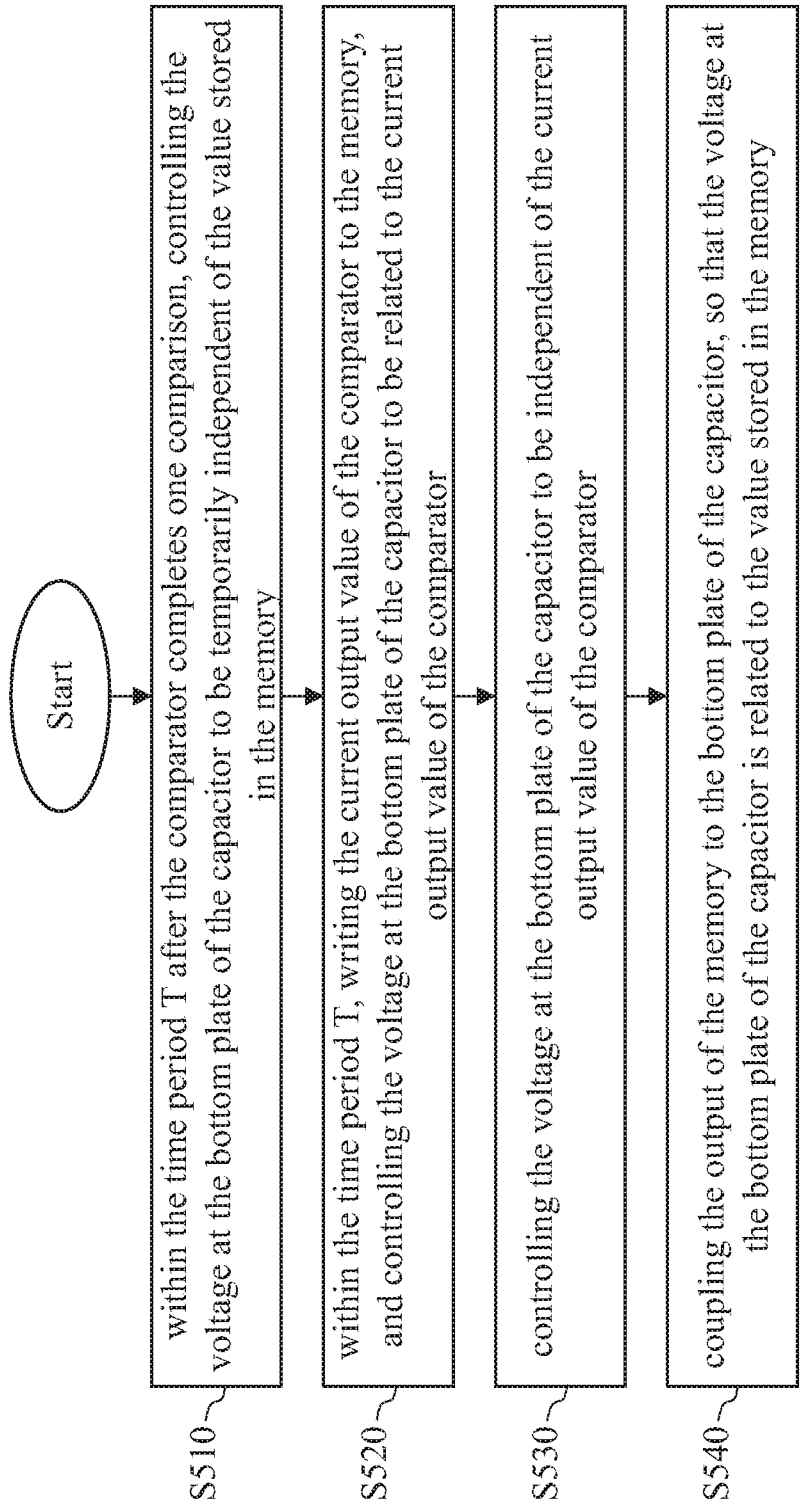
FIG. 5 illustrates a flowchart of a control method of a SAR ADC according to an embodiment of the present invention.

FIG. 4 is a circuit diagram of a sub-control circuit according to an embodiment of the present invention. The sub-control circuit is part of the control circuit of the SAR ADC. FIG. 5 shows a flowchart of a control method of a SAR ADC according to an embodiment of the present invention. The sub-control circuit 405-$k$ is configured to generate the sub-control signal Gk according to the bit Dk+1, and includes the memory 410-$k$, the buffer 420-$k$, the data path 430-$k$, the switch 440-$k$, and the switch 450-$k$. The memory 410-$k$ can be a latch, a flip-flop (e.g., a D flip-flop), a register, or a circuit that can store data. The buffer 420-$k$ includes an inverter or a plurality of inverters connected in series. The buffer 420-$k$ is coupled between the switch 440-$k$ and the switch SWk and is also coupled between the switch 450-$k$ and the switch SWk.

The memory 410-$k$ is used to store the current output value of the comparator 120 (i.e., the bit Dk+1). The buffer 420-$k$ is used to boost the driving capability of the signal. The data path 430-$k$, which is coupled between the output of the comparator 120 and the input of the inverter (i.e., the switch SWk), contains the switch 440-$k$ and the buffer 420-$k$, but does not contain any memory. In other words, the switch 440-$k$ is also coupled between the output of the comparator 120 and the input of the inverter. The bit Dk+1 in the figure may be the output of the comparator 120 or a register value of the SAR 130. Within a time period T after the comparator 120 completes one comparison, the switch 440-$k$ is turned on and the switch 450-$k$ is turned off. That is to say, the sub-control circuit 405-$k$ uses the data path 430-$k$ to control the voltage at the bottom plate of the capacitor Ck to be temporarily (i.e., within the time period T) independent of the value stored in the memory 410-$k$; that is, the voltage at the bottom plate of the capacitor Ck is not controlled by the value stored in the memory 410-$k$ for a certain period of time (step S510).

Within the above-mentioned time period T when the data path 430-$k$ is providing data and/or signal transmission, the sub-control circuit 405-$k$ writes the current output value (bit Dk+1) of the comparator 120 to the memory 410-$k$, and, at the same time, controls the output of the comparator 120 to be coupled to the bottom plate of the capacitor Ck via the data path 430-$k$. In this way, the voltage at the bottom plate of the capacitor Ck is related to the current output value of the comparator 120, that is, the voltage at the bottom plate of the capacitor Ck is controlled by the current output value of the comparator 120 (step S520). Within the above-mentioned time period T when the switch 440-$k$ is turned on and the switch 450-$k$ is turned off, the voltage at the bottom plate of the capacitor Ck and the sub-control signal Gk are related to the bit Dk+1 but not related to the value stored in the memory 410-$k$. In other words, the sub-control circuit 405-$k$ controls the voltage at the bottom plate of the capacitor Ck according to the current output value of the comparator 120 while updating the value stored in the memory 410-$k$. As a result, the voltage at the bottom plate of the capacitor Ck can be switched earlier to overcome the delay caused by the memory 410-$k$.

Next, when the time period T ends, the switch 450-$k$ is turned on and the switch 440-$k$ is turned off, rendering the data path 430-$k$ incapable of providing data and/or signal transmission. In this instance, the sub-control circuit 405-$k$ stops coupling the output of the comparator 120 to the bottom plate of the capacitor Ck through the data path 430-$k$ so as to control the voltage at the bottom plate of the capacitor Ck to be independent of the current output value of the comparator 120 (i.e., the voltage at the bottom plate of the capacitor Ck is not controlled by the current output value of the comparator 120) (step S530). The sub-control circuit 405-$k$ controls the output of the memory 410-$k$ to be coupled to the bottom plate of the capacitor Ck via the switch SWk by controlling the switch 450-$k$ to be turned on and the switch 440-$k$ to be turned off, so that the voltage at the bottom plate of the capacitor Ck is related to the value stored in the memory 410-$k$, that is, the voltage at the bottom plate of the capacitor Ck is controlled by the value stored in the memory 410-$k$ (step S540).

In summary, by providing the data path 430-$k$ that does not contain any memory, the delay in the circuit becomes relatively small. As a result, the voltage at the bottom plate of the capacitor Ck can be switched earlier, and the speed and performance of the SAR ADC are therefore improved. The time period T may be the time length starting from the completion of one comparison of the comparator 120 to the bit Dk+1 being successful written to the memory 410-$k$, and in practical implementations the time period T can be set and adjusted according to the writing speed of the memory 410-$k$.

Figure 6:
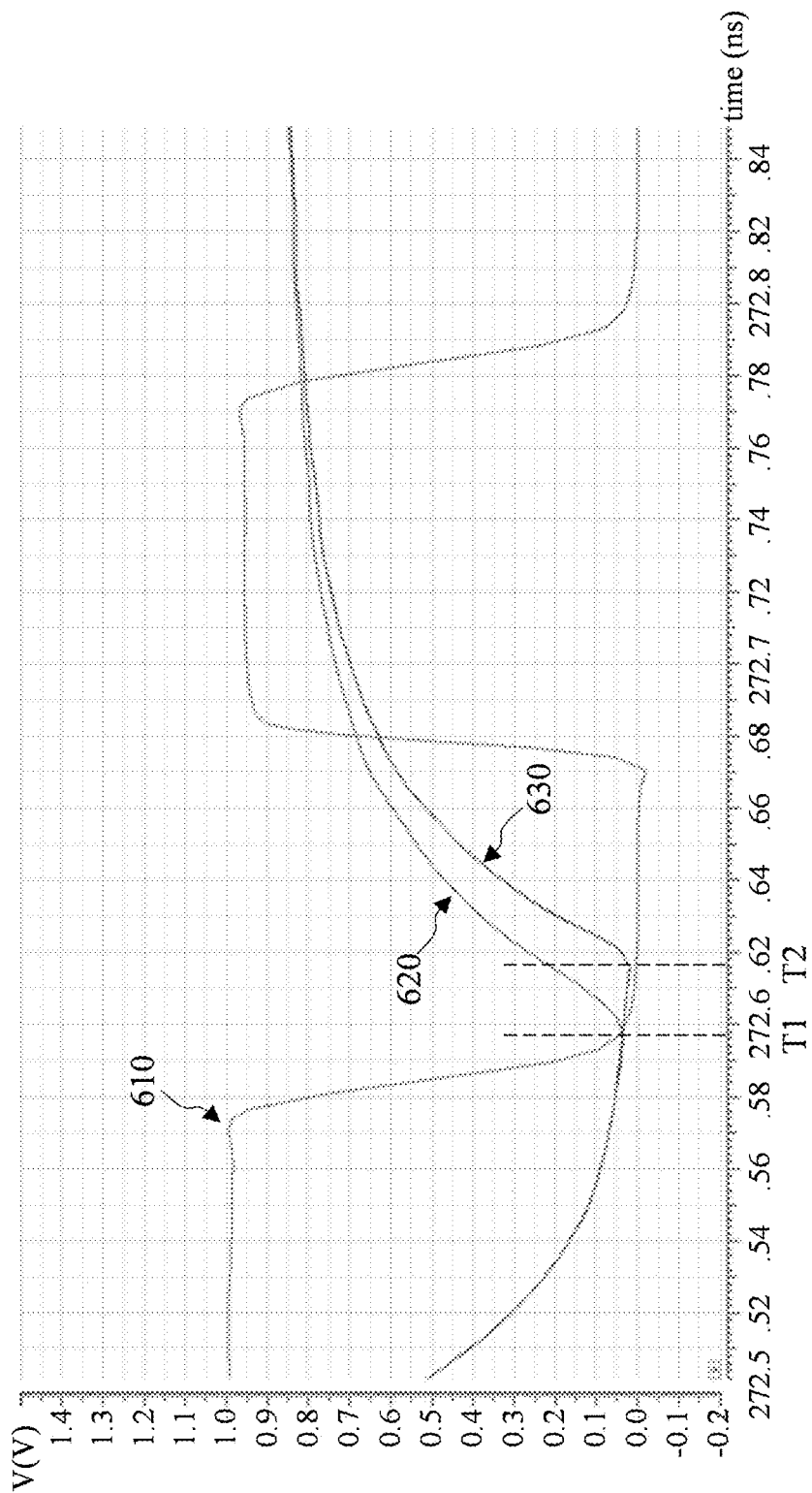
FIG. 6 illustrates the simulation of the voltage at the bottom plate of the capacitor.

FIG. 6 shows the simulation of the voltage at the bottom plate of the capacitor. The curve 610 is the output of the comparator 120, and the curve 620 and curve 630 represent the voltage at the bottom plate of the capacitor. The curve 620 corresponds to the control circuit of the present invention and the curve 630 corresponds to a conventional control circuit. As shown in the figure, when the comparator 120 completes the comparison (at time point T1), the control circuit and the control method of the present invention can cause the voltage at the bottom plate of the capacitor to change immediately, whereas in the conventional circuit, not until time point T2 does the voltage at the bottom plate of the capacitor start to change. This simulation proves that this invention can indeed increase the speed of the SAR ADC, which in turn improves the performance of the SAR ADC. The time difference between time point T2 and time point T1 is substantially equal to the total delay caused by the components bypassed by the data path.

Figure 7:
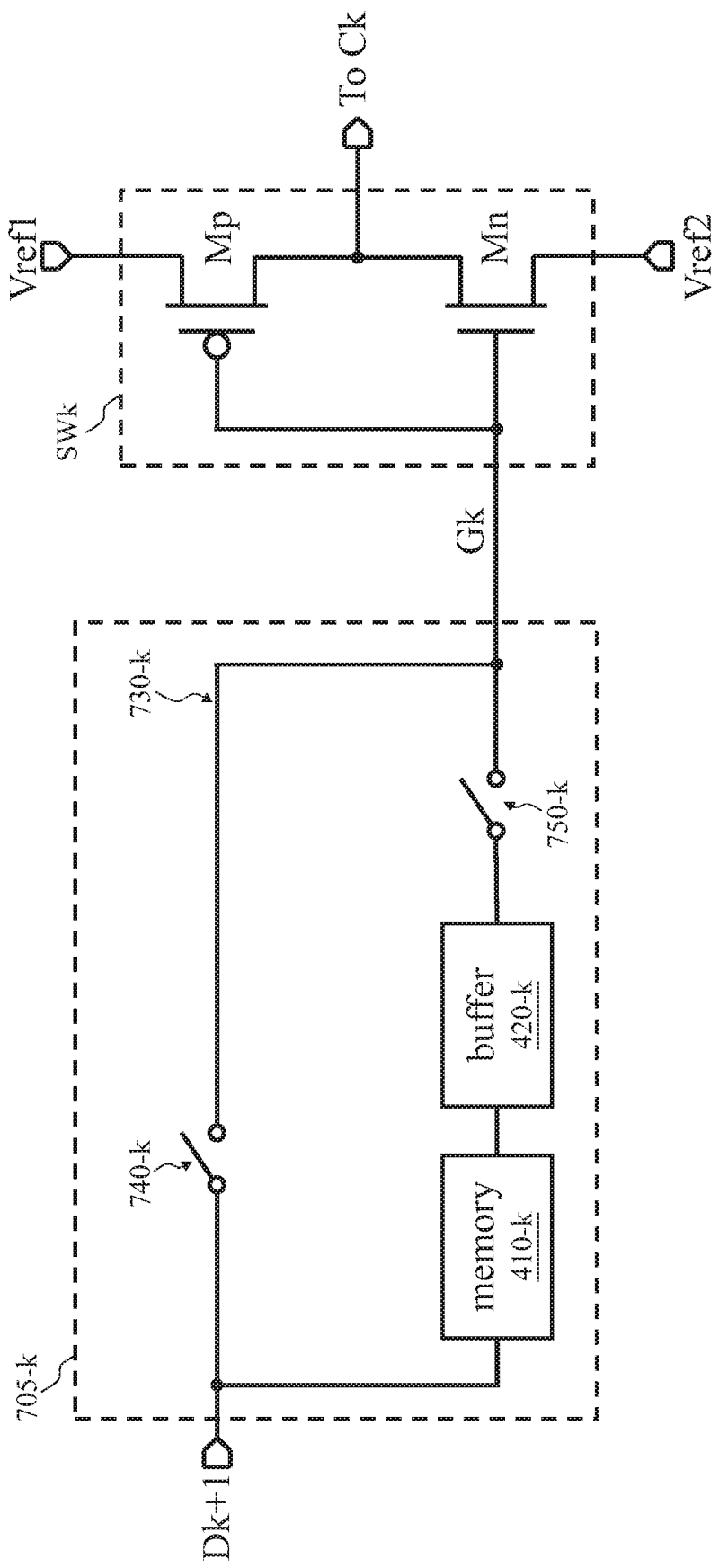
FIG. 7 illustrates a circuit diagram of the sub-control circuit according to another embodiment of the present invention.

FIG. 7 shows a circuit diagram of the sub-control circuit according to another embodiment of the present invention. The sub-control circuit 705-$k$ is configured to generate the sub-control signal Gk according to the bit Dk+1, and includes the memory 410-$k$, the buffer 420-$k$, the data path 730-$k$, the switch 740-$k$, and the switch 750-$k$. The buffer 420-$k$ is coupled between the memory 410-$k$ and the switch 750-$k$. The data path 730-$k$ of the sub-control circuit 705-$k$ bypasses the memory 410-$k$ and the buffer 420-$k$. In other words, the data path 730-$k$ contains the switch 740-$k$ but does not contain any memory and buffer. Compared to the sub-control circuit 405-$k$, the sub-control circuit 705-$k$ can further improve the speed of the SAR ADC because data path 730-$k$ bypasses more components.

Figure 8:
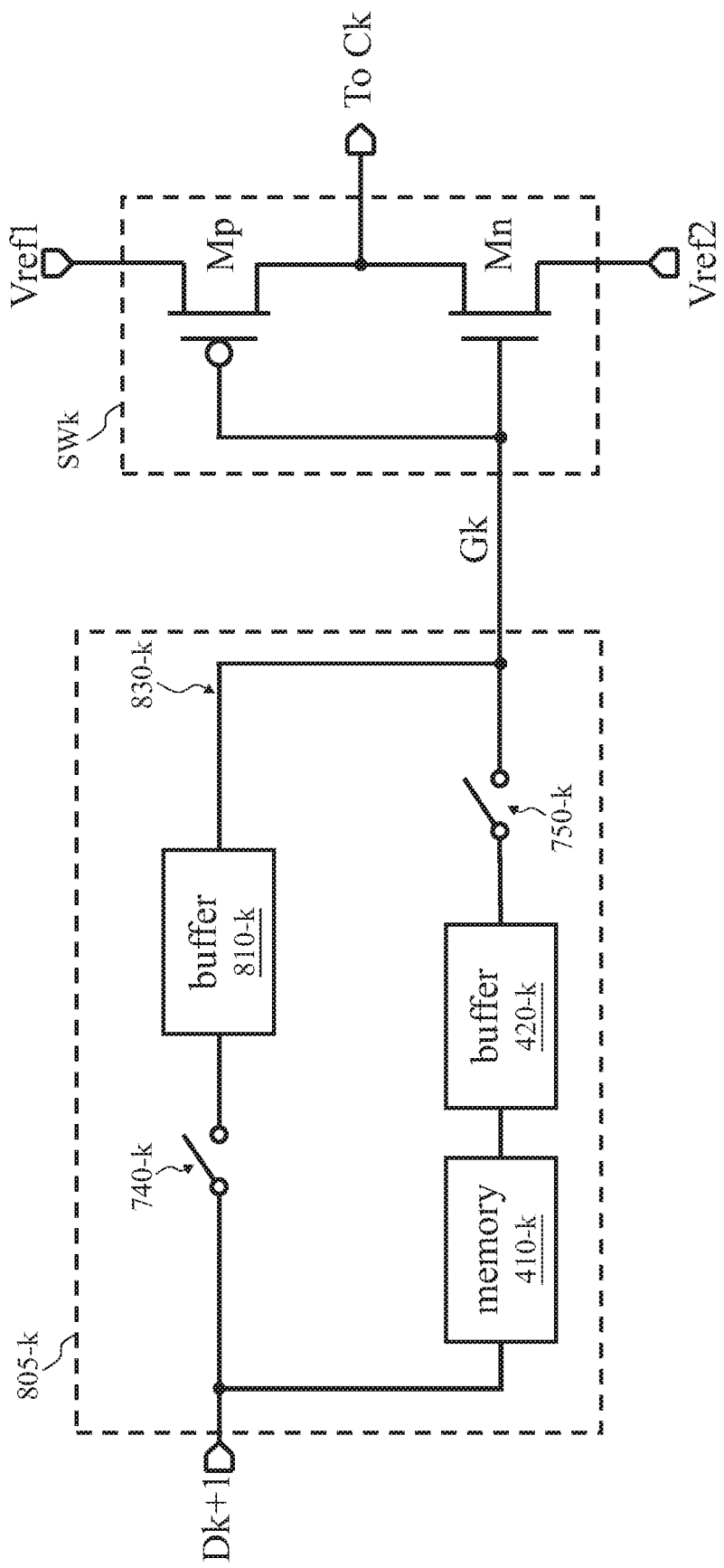
FIG. 8 illustrates a circuit diagram of the sub-control circuit according to another embodiment of the present invention.

FIG. 8 shows a circuit diagram of the sub-control circuit according to another embodiment of the present invention. The sub-control circuit 805-$k$ is configured to generate the sub-control signal Gk according to the bit Dk+1, and includes the memory 410-$k$, the buffer 420-$k$, the buffer 810-$k$, the data path 830-$k$, the switch 740-$k$, and the switch 750-$k$. The buffer 810-$k$ is coupled between the switch 740-$k$ and the switch SWk. The data path 830-$k$ contains the switch 740-$k$ and the buffer 810-$k$, but does not contain any memory. The buffer 810-$k$, which includes at least one inverter, boosts the driving capability of the signals on the data path 830-$k$.

Since a person having ordinary skill in the art can appreciate the implementation detail and the modification thereto of the present method invention through the disclosure of the device invention, repeated and redundant description is thus omitted. Please note that there is no step sequence limitation for the method inventions as long as the execution of each step is applicable. Furthermore, the shape, size, and ratio of any element and the step sequence of any flow chart in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A control circuit of a successive approximation register analog-to-digital converter (SAR ADC), wherein the SAR ADC comprises a comparator and a switched-capacitor digital-to-analog converter (DAC), the control circuit comprising:
   a memory configured to store an output value of the comparator;
   an inverter having an output coupled to a first end of a capacitor of the switched-capacitor DAC, wherein a second end of the capacitor is coupled to an input of the comparator; and
   a data path coupled between an output of the comparator and an input of the inverter and configured to cause a voltage at the first end of the capacitor to be temporarily controlled by the output value of the comparator;
   wherein the data path does not contain any memory.

2. The control circuit of claim 1 further comprising:
   a buffer coupled between the memory and the inverter and configured to boost driving capability of signals;
   wherein the data path contains the buffer.

3. The control circuit of claim 1 further comprising:
   a buffer coupled between the memory and the inverter and configured to boost driving capability of signals;
   wherein the data path does not contain the buffer.

4. The control circuit of claim 3, wherein the buffer is a first buffer, the control circuit further comprising:
   a second buffer located on the data path and configured to boost driving capability of signals.

5. A control circuit of a successive approximation register analog-to-digital converter (SAR ADC), wherein the SAR ADC comprises a comparator and a switched-capacitor digital-to-analog converter (DAC), the control circuit comprising:
   a memory configured to store an output value of the comparator;
   an inverter having an output coupled to a first end of a capacitor of the switched-capacitor DAC, wherein a second end of the capacitor is coupled to an input of the comparator;
   a first switch coupled between an output of the comparator and an input of the inverter; and a second switch coupled between an output of the memory and the input of the inverter;

wherein when the first switch is turned on, the second switch is turned off so that a voltage at the first end of the capacitor is not controlled by a value stored in the memory, and the memory stores the output value of the comparator;

wherein when the first switch is turned off, the second switch is turned on so that the voltage at the first end of the capacitor is controlled by the value stored in the memory but not controlled by the output value of the comparator.

6. The control circuit of claim 5, wherein the output value of the comparator is written to the memory when the first switch is turned on.

7. The control circuit of claim 5 further comprising:
a buffer coupled between the first switch and the inverter and coupled between the second switch and the inverter and configured to boost driving capability of signals.

8. The control circuit of claim 5 further comprising:
a buffer coupled between the memory and the second switch and configured to boost driving capability of signals.

9. The control circuit of claim 8, wherein the buffer is a first buffer, the control circuit further comprising:

a second buffer coupled between the first switch and the inverter and configured to boost driving capability of signals.

10. A control method of a successive approximation register analog-to-digital converter (SAR ADC), wherein the SAR ADC comprises a comparator and a switched-capacitor digital-to-analog converter (DAC), the control method comprising:

controlling, within a time period after a comparison of the comparator is completed, a voltage at a first end of a capacitor of the switched-capacitor DAC not to be controlled by a value stored in a memory;

writing a current output value of the comparator to the memory within the time period, and controlling the voltage at the first end of the capacitor to be controlled by the current output value of the comparator;

stopping coupling an output of the comparator to the first end of the capacitor to thereby control the voltage at the first end of the capacitor not to be controlled by the current output value of the comparator; and controlling an output of the memory to be coupled to the first end of the capacitor, such that the voltage at the first end of the capacitor is controlled by the value stored in the memory.

* * * * *